(12) United States Patent
Cheng et al.

(10) Patent No.: US 9,786,547 B2
(45) Date of Patent: Oct. 10, 2017

(54) CHANNEL SILICON GERMANIUM FORMATION METHOD

(71) Applicant: International Business Machines Corporation, Armonk, NY (US)

(72) Inventors: Kangguo Cheng, Schenectady, NY (US); Nicolas Degors, Le Versound (FR); Shawn P. Fetterolf, Cornwall, VT (US); Ahmet S. Ozcan, San Jose, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/134,898

(22) Filed: Apr. 21, 2016

(65) Prior Publication Data

US 2017/0170055 A1    Jun. 15, 2017

Related U.S. Application Data

(62) Division of application No. 14/969,670, filed on Dec. 15, 2015.

(51) Int. Cl.
*H01L 21/762* (2006.01)
*H01L 21/321* (2006.01)
(Continued)

(52) U.S. Cl.
CPC .. *H01L 21/76283* (2013.01); *H01L 21/31155* (2013.01); *H01L 21/321* (2013.01); *H01L 21/32055* (2013.01)

(58) Field of Classification Search
None
See application file for complete search history.

(56) References Cited

U.S. PATENT DOCUMENTS 6,633,066 B1 * 10/2003 Bae ............... H01L 21/76254
257/347
2005/0133819 A1 * 6/2005 Kawasaki ....... H01L 21/823807
257/195

(Continued)

OTHER PUBLICATIONS

Cheng, Kangguo, et al.; "Novel Channel Silicon Germanium Formation Method"; U.S. Appl. No. 14/969,670, filed Dec. 15, 2015.
(Continued)

*Primary Examiner* — William Coleman
*Assistant Examiner* — Kien Ly
(74) *Attorney, Agent, or Firm* — Cantor Colburn LLP; Steven Meyers

(57) ABSTRACT

A method of making a channel region in a semiconductor device includes providing a substrate having a first transistor area arranged adjacent to a second transistor area; growing an epitaxial layer on the second transistor area of the substrate; forming a trench in the substrate between the first transistor area and the second transistor area; performing a condensation technique to thermally mix materials of the epitaxial layer and the substrate; and filling the trench with a dielectric material to form a shallow trench isolation region between a first channel region of the first transistor and a second channel region of the second transistor; wherein performing the condensation technique is performed after forming the trench.

13 Claims, 12 Drawing Sheets

(51) Int. Cl.
*H01L 21/3205* (2006.01)
*H01L 21/3115* (2006.01)

(56) References Cited

U.S. PATENT DOCUMENTS

| | | | | |
|---|---|---|---|---|
| 2005/0269640 | A1* | 12/2005 | Shimamoto | H01L 27/1203 257/351 |
| 2006/0068557 | A1* | 3/2006 | Ochimizu | H01L 21/76281 438/312 |
| 2006/0151833 | A1* | 7/2006 | Yang | H01L 21/76283 257/347 |
| 2007/0108481 | A1* | 5/2007 | Thean | H01L 27/1203 257/288 |
| 2007/0148894 | A1* | 6/2007 | Orlowski | H01L 21/84 438/370 |
| 2009/0035914 | A1* | 2/2009 | Sadaka | H01L 21/76205 438/413 |
| 2010/0052057 | A1* | 3/2010 | Chung | H01L 29/0634 257/362 |
| 2013/0193514 | A1* | 8/2013 | Loubet | H01L 21/84 257/347 |
| 2014/0312423 | A1* | 10/2014 | Cheng | H01L 21/823807 257/351 |
| 2014/0363953 | A1* | 12/2014 | Dutartre | H01L 21/7624 438/479 |
| 2015/0206972 | A1* | 7/2015 | Liu | H01L 21/823807 257/348 |

OTHER PUBLICATIONS

List of IBM Patents or Patent Applications Treated As Related—Date Filed: Apr. 29, 2016; 1 page.

* cited by examiner

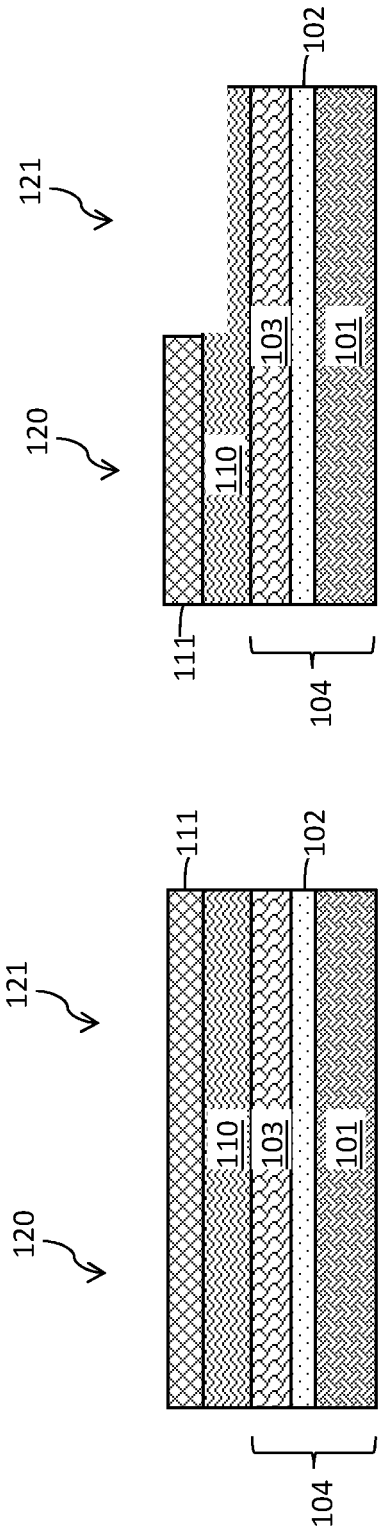

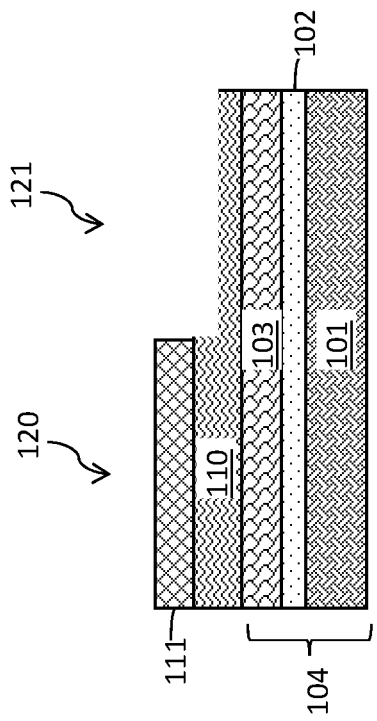
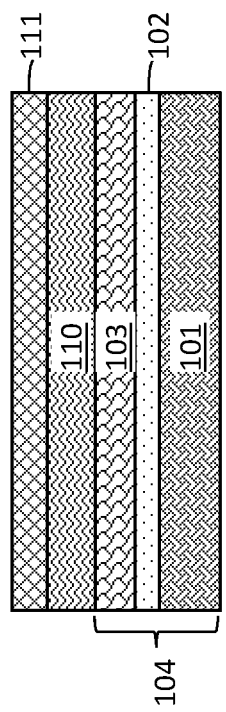
FIG. 2B
FIG. 2A

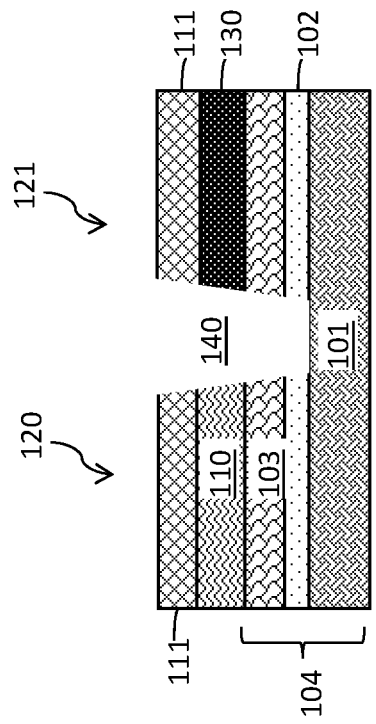
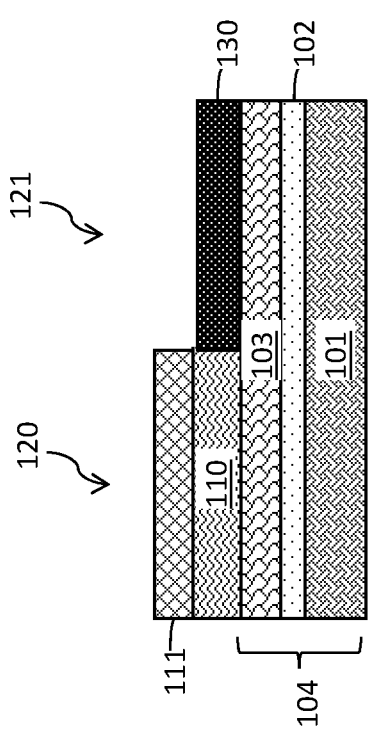
FIG. 2D
FIG. 2C

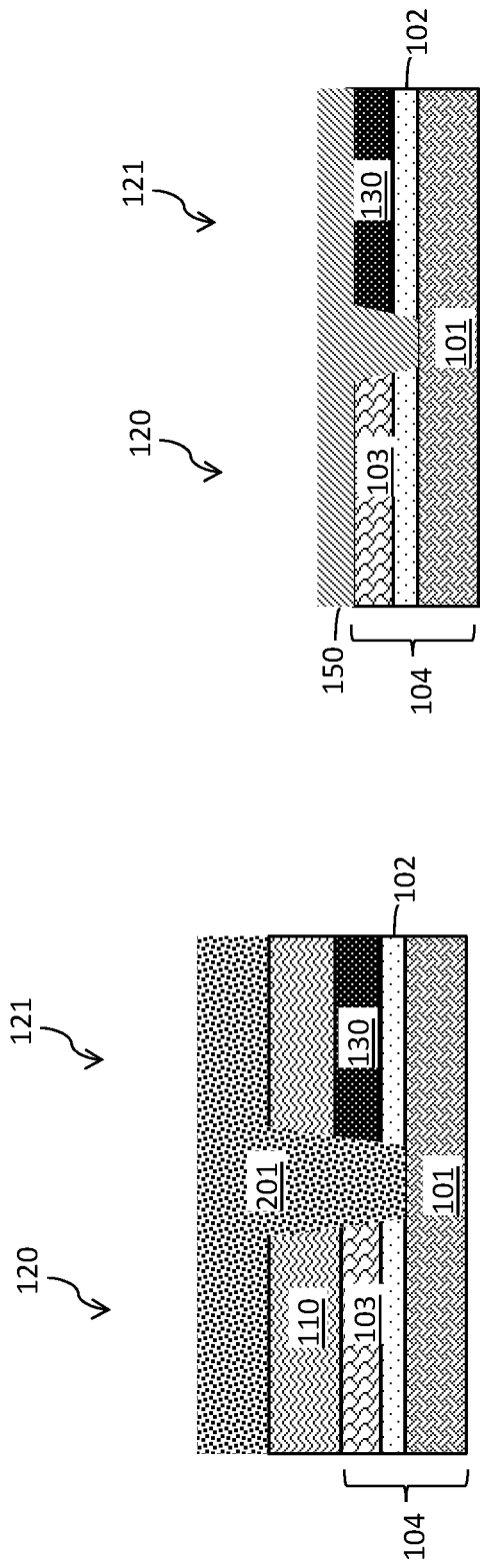

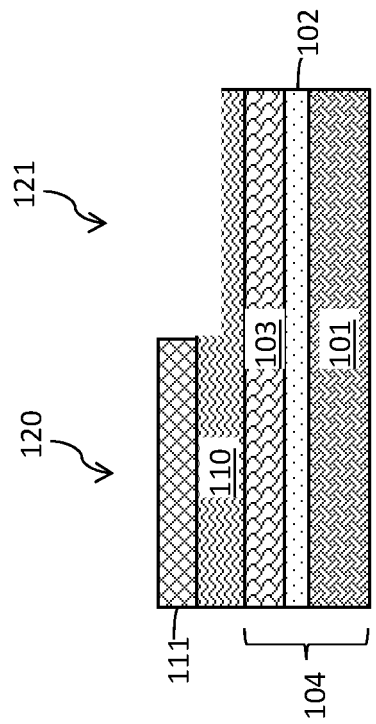
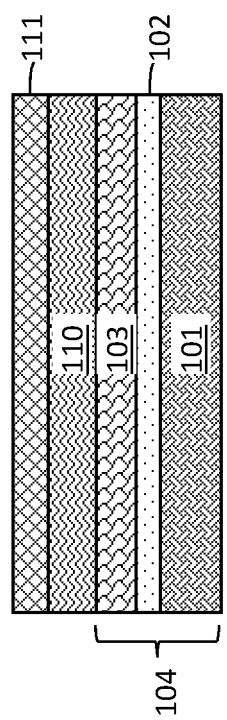
FIG. 3B
FIG. 3A

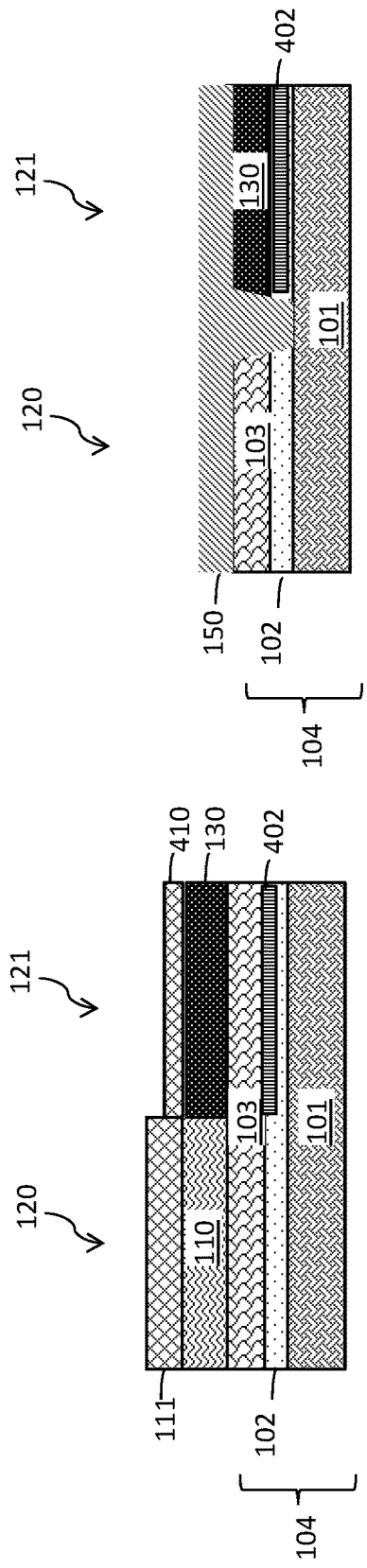

CHANNEL SILICON GERMANIUM FORMATION METHOD

DOMESTIC PRIORITY

This application is a continuation of and claims priority from U.S. patent application Ser. No. 14/969,670, filed on Dec. 15, 2015, entitled "NOVEL CHANNEL SILICON GERMANIUM FORMATION METHOD", the entire contents of which are incorporated herein by reference.

BACKGROUND

The present invention relates to complementary metal oxide semiconductor (CMOS), and more specifically, to channel structures and process flows.

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET or NMOS) and p-type field effect transistors (pFET or PMOS) are two types of complementary MOSFETs. The nFET uses electrons as the current carriers and with n-doped source and drain junctions. The pFET uses holes as the current carriers and with p-doped source and drain junctions.

SUMMARY

According to an embodiment, a method of making a channel region in a semiconductor device includes providing a substrate having a first transistor area arranged adjacent to a second transistor area; growing an epitaxial layer on the second transistor area of the substrate; forming a trench in the substrate between the first transistor area and the second transistor area; performing a condensation technique to thermally mix materials of the epitaxial layer and the substrate; and filling the trench with a dielectric material to form a shallow trench isolation region between a first channel region of the first transistor and a second channel region of the second transistor; wherein performing the condensation technique is performed after forming the trench.

According to another embodiment, a method of making a channel region in a semiconductor device includes providing a substrate having a first transistor area arranged adjacent to a second transistor area, the substrate having a silicon support layer, a buried oxide layer arranged on the silicon support layer, and a silicon layer arranged on the buried oxide layer; growing an epitaxial layer comprising germanium on the second transistor area of the substrate; forming a trench in the substrate between the first transistor area and the second transistor area; filling the trench with a dielectric material and annealing to form a shallow trench isolation region between a first channel region of the first transistor and a second channel region of the second transistor; and performing a condensation technique to thermally mix materials of the germanium of epitaxial layer with the silicon layer of the substrate to form a silicon germanium layer arranged on the buried oxide layer; wherein performing the filling the trench and annealing is performed before the condensation technique.

Yet, according to another embodiment, a semiconductor device includes a substrate having a first transistor area adjacent to a second transistor area, the substrate having a silicon support layer, a buried oxide layer arranged on the silicon support layer, and a silicon layer arranged on the buried oxide layer, a portion of the buried oxide layer comprising an implant comprising a reaction product of an implanted ion and a compound of the buried oxide layer; a trench extending from a surface of the silicon layer to the silicon support layer between the first transistor area and the second transistor area; and a silicon germanium layer arranged on the buried oxide layer of the second transistor area; wherein the silicon layer forms a channel region of the first transistor area, and the silicon germanium layer forms a channel region of the second transistor area.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-1F illustrate exemplary methods of making channel structures semiconductor devices according to a first embodiment, in which:

FIG. 1A is a cross-sectional side view of a mask arranged on a silicon-on-insulator (SOI) substrate having a first transistor area and a second transistor area;

FIG. 1B is a cross-sectional side view after patterning the mask over the second transistor area;

FIG. 1C is a cross-sectional side view after pre-cleaning and growing an epitaxial layer on the second transistor area;

FIG. 1D is a cross-sectional side view after forming a trench between the first transistor area and the second transistor area;

FIG. 1E is a cross-sectional side view after removing the mask and performing a condensation process; and FIG. 1F is a cross-sectional side view after filling the trench to form a shallow trench isolation (STI) region and annealing;

FIGS. 2A-2F illustrate exemplary methods of making channel regions in semiconductor devices according to a second embodiment, in which:

FIG. 2A is a cross-sectional side view of a mask arranged on a SOI substrate having a first transistor area and a second transistor area;

FIG. 2B is a cross-sectional side view after patterning the mask over the second transistor area;

FIG. 2C is a cross-sectional side view after pre-cleaning and growing an epitaxial layer on the second transistor area;

FIG. 2D is a cross-sectional side view after forming a trench between the first transistor area and the second transistor area;

FIG. 2E is a cross-sectional side view after disposing a compressive liner over the first transistor area and the second transistor area and performing a condensation process; and FIG. 2F is a cross-sectional side view after filling the trench to form an STI region and annealing;

FIGS. 3A-3F illustrate exemplary methods of making channel regions in semiconductor devices according to a third embodiment, in which:

FIG. 3A is a cross-sectional side view of a mask arranged on a SOI substrate having a first transistor area and a second transistor area;

FIG. 3B is a cross-sectional side view after patterning the mask over the second transistor area;

FIG. 3C is a cross-sectional side view after pre-cleaning and growing an epitaxial layer on the second transistor area;

FIG. 3D is a cross-sectional side view after forming a trench between the first transistor area and the second transistor area;

FIG. 3E is a cross-sectional side view after filling the trench to form an STI region and annealing; and FIG. 3F is a cross-sectional side view after performing a condensation process;

FIGS. 4A-4D illustrate exemplary methods of making semiconductor devices according to a fourth embodiment, in which:

FIG. 4A is a cross-sectional side view of ions being implanted into the buried oxide (BOX) layer of the second transistor area;

FIG. 4B is a cross-sectional side view after pre-cleaning and growing an epitaxial layer on the second transistor area;

FIG. 4C is a cross-sectional side view after performing a condensation process; and FIG. 4D is a cross-sectional side view after patterning a trench and filling the trench to form an STI region.

DETAILED DESCRIPTION

Figure 1D:
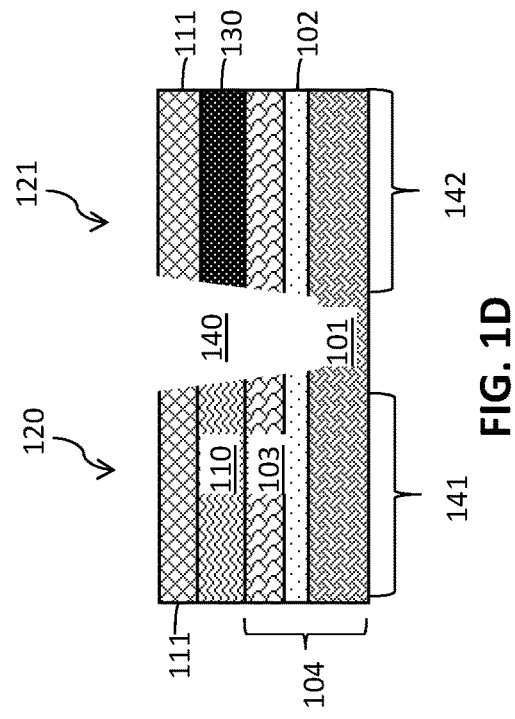

In some process flows for forming channel regions in planar fully-depleted SOI (FDSOI) devices, silicon germanium is formed on silicon in the PMOS, with silicon forming the channel region in the NMOS. When the silicon germanium channel regions are strained in the PMOS, device performance increases. The germanium also lowers the threshold voltage of the device. Such process flows may include patterning a mask over the NMOS and the PMOS and growing an epitaxial silicon germanium layer on the SOI substrate in the PMOS region to form a strained layer. Then rapid thermal oxidation (RTO) condensation (conversion) is performed to drive down the epitaxial layer into the substrate, and a trench is formed between the NMOS and the PMOS that will be filled to form a STI region between the transistors.

However, one challenge performing the RTO condensation before forming the trench is that some germanium from the PMOS channel may diffuse over into the NMOS area if the STI region is too small. Although the STI is placed in the area between the transistors to remove the transition zone, the STI region becomes smaller as devices themselves scale to smaller dimensions. In some devices, the STI region may not be wide enough to remove this transition zone, which may lead to threshold voltage changes in the NMOS.

Another challenge of performing the RTO condensation before forming the trench is that the strained silicon germanium layer may relax after the trench is formed. Relaxation may occur through various mechanisms, for example, dislocations, buckling, or lateral expansion. Although the silicon germanium layer may only relax on the edges when the channel length is long, the silicon germanium may fully relax in small devices with shorter channel lengths.

After the silicon germanium layer is driven down onto the BOX (buried oxide) layer following condensation, the BOX layer may help to maintain stress. The viscosity of the BOX layer affects the ability to maintain stress in the silicon germanium layer. The temperature of the BOX layer also modulates the viscosity. Lower temperatures may affect the oxide viscosity, and thus, avoid relaxation of the silicon germanium layer.

Accordingly, various embodiments provide semiconductor devices and methods of making semiconductor devices in which the trench is formed between the PMOS and NMOS before depositing and condensing (converting) the silicon germanium on the PMOS and the STI fill. In some embodiments, a compressive nitride liner may be deposited on the NMOS silicon layer and the PMOS silicon germanium layer before the STI fill. In other embodiments, the silicon germanium is deposited on the PMOS before the trench is formed and filled, and the silicon germanium is converted after the STI fill. Still yet, in other embodiments, the BOX layer of the substrate may be implanted to modify the oxide material and make the substrate more/less compliant, which will affect the strain of the silicon germanium layer disposed thereon.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Turning now to the Figures, FIGS. 1A-1F illustrate exemplary methods of making channel regions in semiconductor devices according to a first embodiment. FIG. 1A is a cross-sectional side view of a mask 111 arranged on a silicon-on-insulator (SOI) substrate 104 having a first transistor 120 area and a second transistor 121 area adjacent to the first transistor 120 area. In the exemplary embodiment, first transistor 120 is an NMOS (nFET), and second transistor 121 is a PMOS (PFET). Although, first transistor 120 and second transistor 121 are not limited to these types of transistors.

The SOI substrate 104 includes a semiconductor support layer 101, a buried oxide (BOX) layer 102 arranged on the semiconductor support layer 101, and a thin semiconductor layer 103 arranged on the BOX layer 102. The semiconductor support layer 101 and the semiconductor layer 103 include one or more semiconductor materials. In the exemplary embodiment shown, the semiconductor support layer 101 and the semiconductor layer 103 include silicon. Although, the semiconductor support layer 101 and the semiconductor layer 103 are not limited to these materials. The SOI substrate 104 may be another semiconductor substrate, including, for example, strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof.

The semiconductor support layer 101 may have a thickness in a range from about 1000 to about 8000 nm, or from about 5000 to about 7000 nm. The semiconductor layer 103 is significantly thinner than the semiconductor support layer 101 and may have a thickness in a range from about 3 to about 15 nm, or from about 4 to about 7 nm.

The BOX layer 102 may be an oxide, such a silicon dioxide. The thickness of the BOX layer 102 may be in a range from about 10 to about 200 nm, or from about 15 to about 25 nm.

An oxide layer 110 is arranged on the SOI substrate 104. The oxide layer 110 may be a native oxide layer that depends on the composition of the SOI substrate 104, as well as prior treatment of the SOI substrate 104. The oxide layer 110 may include, for example, silicon dioxide. In other embodiments, the oxide layer 110 may include, for example, $GeO_2$, $Ga_2O_3$, $As_2O_3$, $As_2O_5$, or any combination thereof.

A mask 111 is disposed on the oxide layer 110. The mask 111 may include one or more layers and include a lithographic patterning mask or resist that includes a polymeric material, a hard mask material, or a combination thereof. The resist may be a photoresist. The hard mask material may include, for example, silicon nitride.

FIG. 1B is a cross-sectional side view after patterning the mask 111 over the second transistor 121 area. A portion of the mask 111 is removed by etching the mask 111 over the second transistor 121 area. A portion of the oxide layer 110 also may be removed during the etch process.

Figure 1C:
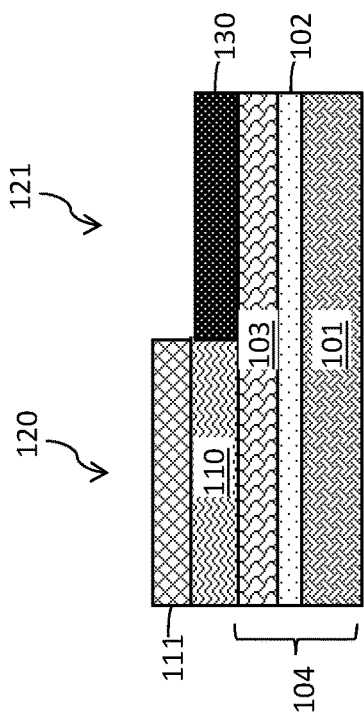

FIG. 1C is a cross-sectional side view after pre-cleaning and growing an epitaxial layer 130 on the second transistor 121 area. Pre-cleaning is performed on the SOI substrate 104 to remove chemical residue or residual amounts of the oxide layer 110 remaining on the PMOS 121. Residual residue or oxide may impede formation of the epitaxial layer 130. The pre-clean process may include a light, non-selective, non-reactive plasma etch.

The epitaxial layer 130 is grown on the semiconductor layer 103 of the SOI 104. The epitaxial layer 130 may include one or more semiconductor materials deposited as one or more layers. In an exemplary embodiment, the epitaxial layer 130 includes germanium, silicon, and/or silicon germanium. The thickness of the epitaxial layer 130 may be in a range from about 2 to about 50 nm, or from about 5 to about 10 nm.

The epitaxial layer 130 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. In some embodiments, the gas source for the deposition of epitaxial layer 130 include a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases, such as hydrogen, nitrogen, helium and argon may be used.

FIG. 1D is a cross-sectional side view after forming a trench 140 in the SOI substrate 104 between the first transistor 120 area and the second transistor 121 area. The trench 140 separates and defines the channel regions of the first transistor 120 (first channel region 141) and the second transistor 121 (second channel region 142).

To form the trench 140, an additional mask 111 is disposed on the epitaxial layer 130 of the second transistor 121 before etching. The additional mask 111 may include the same or different materials than the mask 111 over the first transistor 120. The trench 140 is formed by etching through the mask 111, oxide layer 110, epitaxial layer 130, and a portion of the SOI substrate 104. The trench 140 extends from the mask 111, through the semiconductor layer 103 and BOX layer 102, and into the semiconductor support layer 101.

The dimensions of the trench 140 depend on the dimensions of the device. In some embodiments, the trench 140 may have a width in a range from about 10 to about 500 nm, or from about 10 to about 30 nm. In other embodiments, the trench 140 may have a depth in a range from about 50 to about 500 nm, or from about 150 to about 250 nm.

Figure 1F:
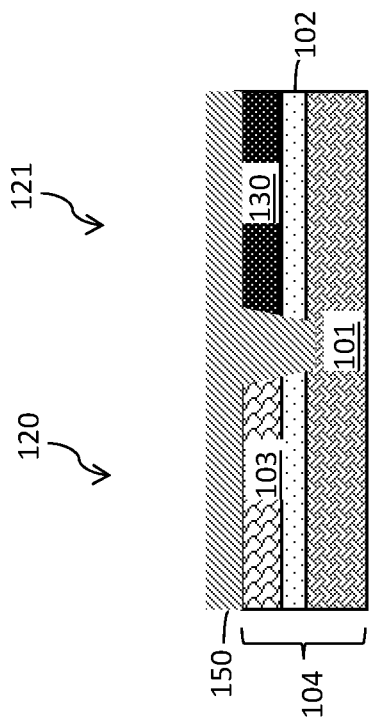
Figure 1E:
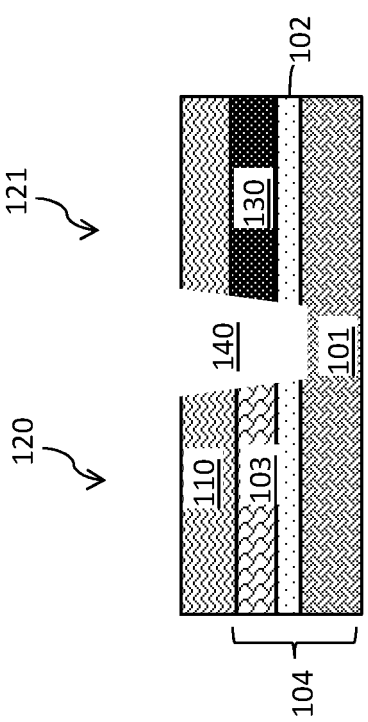

FIG. 1E is a cross-sectional side view after removing the mask 111 and performing a condensation process (thermal mixing). In the exemplary embodiment, the condensation technique is performed to preferentially oxidize the silicon in the second transistor 121 and produce a silicon germanium channel layer (epitaxial layer 130) overlying the BOX layer 102 (i.e., a SiGeOI structure in the second transistor 121). The condensation process also produces, as a byproduct, an oxide layer 110 overlying the silicon germanium channel layer. The oxide layer 110 including silicon dioxide is grown on top of the silicon germanium layer because silicon remains on top as germanium diffuses downward. The silicon on top is then oxidized.

This silicon germanium channel layer has a thickness substantially equal to a thickness of the silicon in the semiconductor layer 103 for the first transistor 120. The thickness of the silicon germanium channel layer of the second transistor 121 is controlled by the thickness of the epitaxial layer 130 and the parameters of the performed condensation technique. Although a substantially equal thickness is shown, some implementations may benefit from different thicknesses in the first and second transistors 120, 121.

The condensation technique may include, for example, a rapid thermal oxidation (RTO) process. The effect of performing the condensation technique on the semiconductor layer 103 and the epitaxial layer 130 is to drive in germanium to form a SiGeOI substrate structure with SiGe channel layer in the second transistor 121 and produce the overlying silicon dioxide layer byproduct (not shown) which is subsequently removed to expose the silicon germanium channel layer for the second transistor 121. The epitaxial layer 130, including silicon germanium in the exemplary embodiment, is driven down to the BOX layer 102.

The condensation technique is performed after forming the trench 140 to pattern the channel regions, which allows the silicon germanium layer (epitaxial layer 130) to remain strained as it adheres to the silicon lattice in the SOI substrate 104. Thus, the germanium cannot diffuse over into the first transistor 120 area. In the exemplary embodiment, the thermal mixing of materials in the epitaxial layer 130 and silicon in the semiconductor layer 103 during the condensation also provides a substantially uniform concentration of germanium in the epitaxial layer 130.

FIG. 1F is a cross-sectional side view after filling the trench 140 to form a shallow trench isolation (STI) region and annealing. The remaining oxide 110 is removed by an oxide etch process, which can be a wet or dry etch removal. The trench 140 is filled with at least one dielectric material 150, for example, silicon dioxide ($SiO_2$). Other non-limiting examples of suitable dielectric materials 150 for the STI regions include tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof.

A heat treatment (anneal) may be performed inside a furnace or by performing a rapid thermal treatment in an atmosphere containing pure inert gases (e.g., nitrogen or argon). The anneal may be performed at a temperature of at least 1000° C., or about 800 to about 1200° C.

FIGS. 2A-2F illustrate exemplary methods of making channel regions in semiconductor devices according to a second embodiment. FIG. 2A is a cross-sectional side view of a mask 111 arranged on a SOI substrate 104 having a first transistor area 120 and a second transistor area 120, as described in FIG. 1A. FIG. 2B is a cross-sectional side view after patterning the mask 111 over the second transistor area 121, as described in FIG. 1B. FIG. 2C is a cross-sectional side view after pre-cleaning and growing an epitaxial layer 130 on the second transistor 121 area, as described in FIG. 1C. FIG. 2D is a cross-sectional side view after forming a trench 140 in the SOI substrate 104 between the first transistor 120 area and the second transistor 121, as described in FIG. 1D.

FIG. 2E is a cross-sectional side view after disposing a compressive liner 201 over the first transistor 120 area, the second transistor 121 area, and within the trench 140, and performing a condensation technique (thermal mixing), as described in FIG. 1E. The compressive liner 201 may include, for example, a compressively stressed nitride material, such as silicon nitride. The compressive liner 201 prevents the epitaxial layer 130 from relaxing during the condensation technique. FIG. 2F is a cross-sectional side view after filling the trench 140 with a dielectric material 150 to form STI region and annealing, as described in FIG. 1F.

Figure 3D:
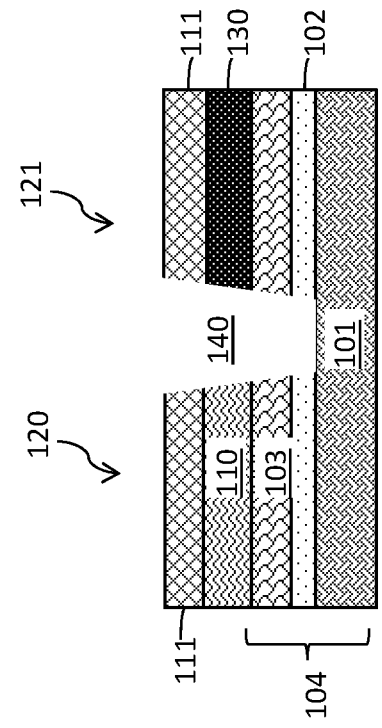
Figure 3C:
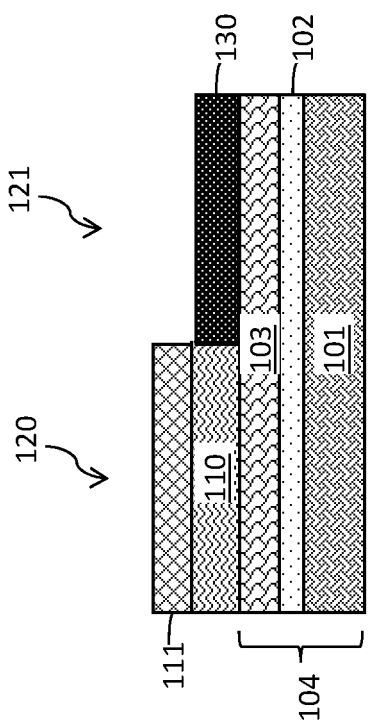

FIGS. 3A-3F illustrate exemplary methods of making channel regions in semiconductor devices according to a third embodiment. FIG. 3A is a cross-sectional side view of a mask 111 arranged on a SOI substrate 104 having a first transistor 120 area and a second transistor 121 area, as described in FIG. 1A. FIG. 3B is a cross-sectional side view after patterning the mask 111 over the second transistor 121 area, as described in FIG. 1B. FIG. 3C is a cross-sectional side view after pre-cleaning and growing an epitaxial layer 130 on the second transistor 121 area, as described in FIG. 1C. FIG. 3D is a cross-sectional side view after forming a trench 140 in the SOI substrate 104 between the first transistor 120 and the second transistor 121, as described in FIG. 1D.

Figure 3F:
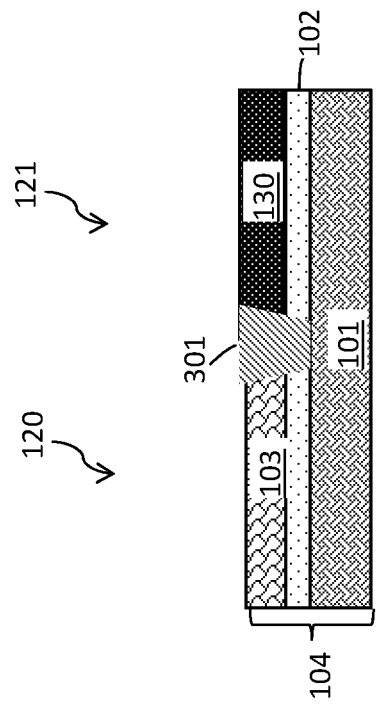
Figure 3E:
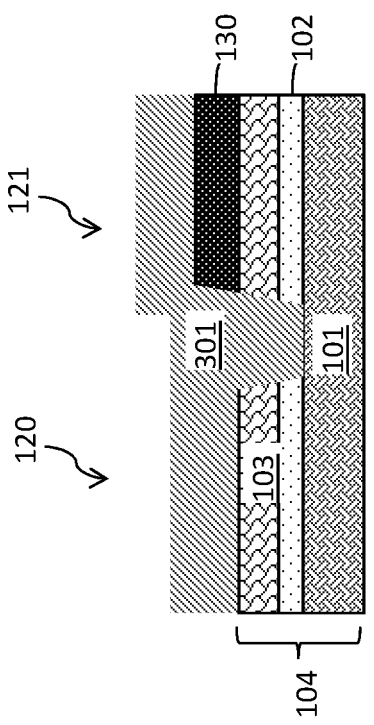

FIG. 3E is a cross-sectional side view after filling the trench 140 with a dielectric material 150 to form an STI region and annealing. The mask 111 is removed before the STI fill. Instead of performing the condensation technique before the STI fill and anneal like in the first embodiment (FIGS. 1E and 1F) and the second embodiment (FIGS. 2E and 2F), performing the STI fill and anneal before condensation prevents further relaxation of the epitaxial layer 130 during the anneal. The STI fill and anneal may be performed as described in FIG. 1F.

FIG. 3F is a cross-sectional side view after condensing the epitaxial layer 130 (thermal mixing), which is performed after the STI fill and anneal (FIG. 3E). The condensation technique may be performed as described in FIG. 1E.

Figure 4B:
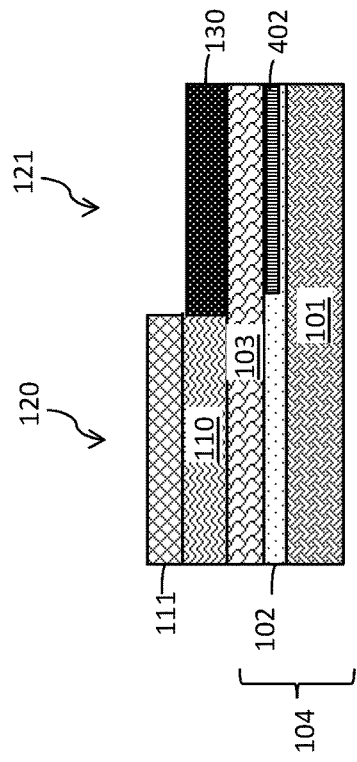
Figure 4A:
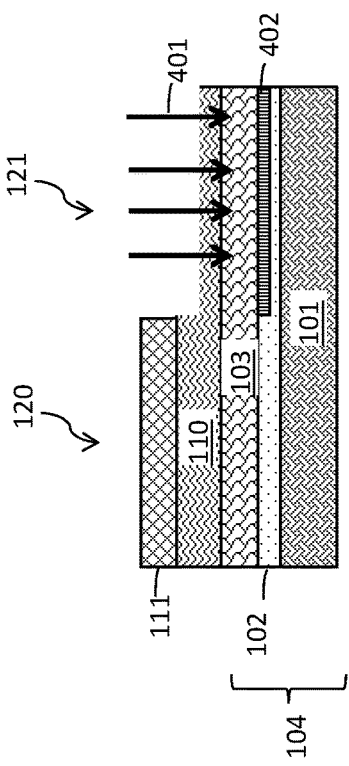

FIGS. 4A-4D illustrate exemplary methods of making channel regions in semiconductor devices according to a fourth embodiment. FIG. 4A is a cross-sectional side view of ions 401 being implanted into the BOX layer 102 of the second transistor 121 area, after patterning the mask 111 over the second transistor 121, as described in FIGS. 1A and 1B. The ions 401 react with compounds in the BOX layer 102 to form an implant 402 that includes a reaction product of the implanted ions 401 and one or more compounds of the BOX layer 102.

Implanting the ions 401 in the BOX layer 102 makes the BOX layer 102 more or less compliant, depending on the type of ion. The implanted ions thus alter the viscosity of the BOX layer 102. Increasing the viscosity of the BOX layer 102 makes the SOI substrate 104 less compliant. Therefore, when the epitaxial layer 130, such as the silicon germanium in the exemplary embodiment, is arranged on the BOX layer 102 after condensation, the silicon germanium will have more strain.

Implanting different ions 401 may tune BOX layer 102 compliance for different devices. For example, for LOGIC PMOS devices, the BOX layer 102 may be made less compliant, which provides more stress, by implanting nitrogen ions 401. In another example, for a SRAM pull-up, the BOX layer 102 may be made more compliant, which provides less stress (more relaxation), by implanting boron or phosphorus ions.

The ions 401 may be implanted using any suitable implantation method, for example, conventional ion implantation or gas cluster ion beam implantation or molecular ion implantation. When the ions 401 are nitrogen ions, at least a portion of the BOX layer 102 is modified to include silicon nitride or silicon oxynitride, which is less compliant than silicon dioxide. The surface of the BOX layer 102 or a portion of the BOX layer 102 may be modified to include the implant 402 (e.g., silicon nitride or silicon oxynitride), or all of the BOX layer 102 may be modified with the implant 402.

When the ions 401 are boron ions and/or phosphorus ions, at least a portion of the BOX layer 102 is modified to include boron-containing compounds and/or phosphorus-containing compounds (e.g., borophosphosilicate glass (BPSG)), which is more compliant than silicon dioxide. The surface or a portion of the BOX layer 102 may be modified to include the implant 402 (e.g., BPSG), or all of the BOX layer 102 may be modified with the implant 402.

FIG. 4B is a cross-sectional side view after pre-cleaning and growing an epitaxial layer 130 on the second transistor 121 area, as described in FIG. 1C. FIG. 4C is a cross-sectional side view after performing a condensation technique, as described in FIG. 1E. Although the condensation technique may be performed before forming the trench between the transistors as shown, the condensation technique may be performed after forming the trench, as shown in other embodiments. FIG. 4D is a cross-sectional side view after patterning a trench between the first transistor area 120 and the second transistor area 121 and filling the trench with a dielectric material 150 to form an STI region, as described in FIG. 1F.

Figure 5:
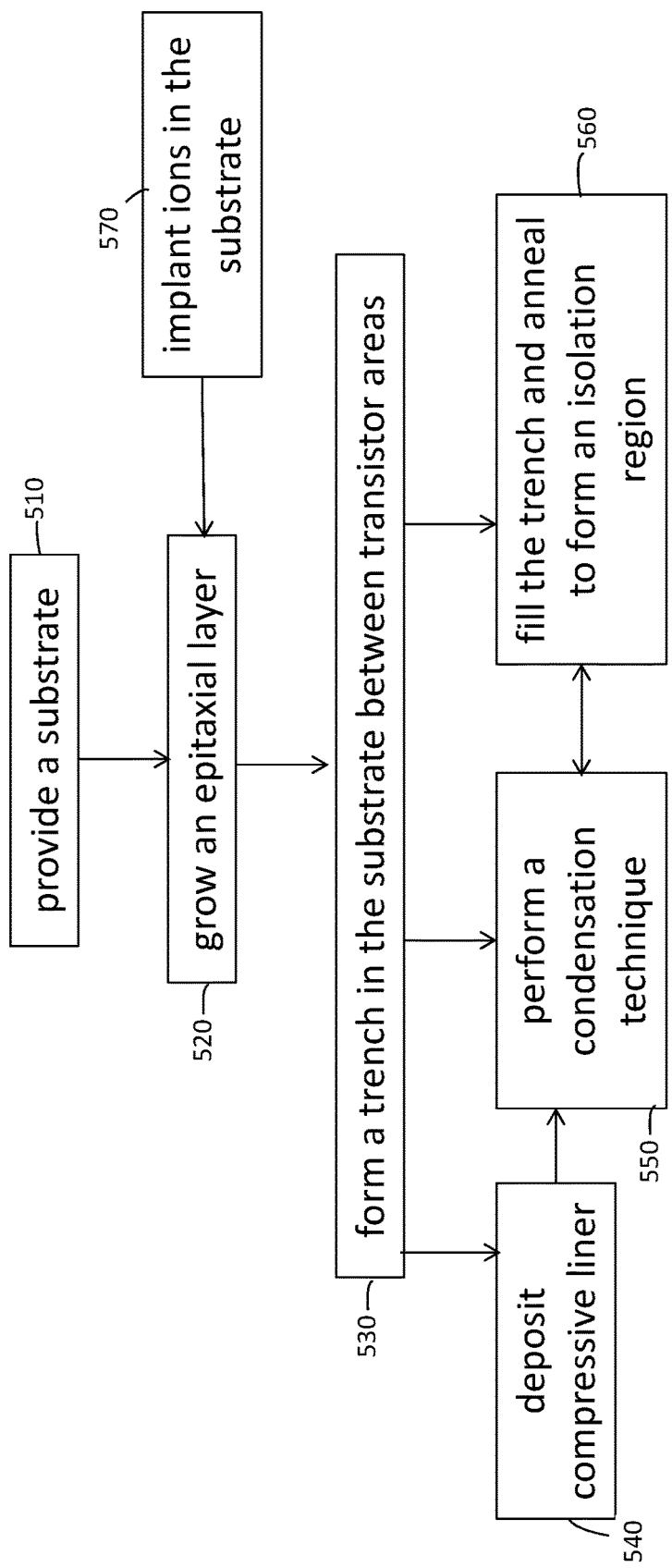
FIG. 5 is a flow diagram of a process flow for making channel regions in semiconductor devices according to embodiments.

FIG. 5 is a flow diagram of a process flow for making channel regions in semiconductor devices according to embodiments. At box 510, a substrate is provided. The substrate may be a SOI substrate with a buried oxide layer. The substrate has a first transistor area arranged adjacent to a second transistor area. At box 520, an epitaxial layer is grown on the second transistor area of the substrate. In an exemplary embodiment, the epitaxial layer includes germanium and/or silicon germanium. At box 570, optionally, ions may be implanted into the substrate before the epitaxial growth. When the substrate is a SOI substrate, the ions are implanted into the buried oxide layer to increase or decrease compliance of the substrate. At box 530, a trench is formed in the substrate between the first transistor area and the second transistor area. At box 540, an optional compressive liner is disposed on the first and second transistor areas and in the trench. At box 550 a condensation technique is performed to thermally mix materials of the epitaxial layer and the substrate. In some embodiments, a silicon germanium layer may be formed on the buried oxide layer of the substrate. At box 560, the trench is filled with a dielectric material to form an isolation region between the first and second transistor areas and an anneal is performed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a channel region in a semiconductor device, the method comprising:
providing a substrate having a first transistor area arranged adjacent to a second transistor area, the substrate comprising a silicon support layer, a buried oxide layer arranged on the silicon support layer, and a silicon layer arranged on the buried oxide layer;
growing an epitaxial layer only on the second transistor area of the substrate, the first transistor area protected by a mask;
forming a trench in the substrate between the first transistor area and the second transistor area, the trench directly contacting the silicon support layer and extending through the buried oxide layer and the silicon layer;
performing a condensation technique to thermally mix materials of the epitaxial layer and the substrate in only the second transistor area, the trench remaining an opening in the substrate while the condensation technique is being performed; and
filling the trench with a dielectric material to form a shallow trench isolation region between a first channel region of the first transistor and a second channel region of the second transistor;
wherein performing the condensation technique is performed after forming the trench.

2. The method of claim 1, wherein the epitaxial layer comprises germanium.

3. The method of claim 1, wherein performing the condensation technique forms a silicon germanium layer having substantially uniform germanium content.

4. The method of claim 1, wherein the condensation technique comprises a rapid thermal oxidation (RTO).

5. The method of claim 1, further comprising depositing a compressive nitride liner layer over the substrate and within the trench before performing the condensation technique.

6. The method of claim 1, further comprising annealing after filling the trench with the dielectric material at a temperature of at least 1000° C.

7. The method of claim 1, wherein the substrate comprises a silicon support layer, a buried oxide layer arranged on the semiconductor support layer, and a silicon layer arranged on the buried oxide layer.

8. The method of claim 7, wherein the epitaxial layer comprises germanium, and performing the condensation technique converts the silicon layer of the substrate to a silicon germanium layer arranged on the buried oxide layer.

9. A method of making a channel region in a semiconductor device, the method comprising:
providing a substrate having a first transistor area arranged adjacent to a second transistor area, the substrate having a silicon support layer, a buried oxide layer arranged on the silicon support layer, and a silicon layer arranged on the buried oxide layer;
growing an epitaxial layer comprising germanium only on the second transistor area of the substrate, the first transistor area protected by a mask;
forming a trench in the substrate between the first transistor area and the second transistor area, the trench directly contacting the silicon support layer and extending through the buried oxide layer and the silicon layer;
filling the trench with a dielectric material and annealing to form a shallow trench isolation region between a first channel region of the first transistor and a second channel region of the second transistor; and
performing a condensation technique to thermally mix materials of the germanium of epitaxial layer with the silicon layer of the substrate to form a silicon germanium layer arranged on the buried oxide layer, the trench remaining an opening in the substrate while the condensation technique is being performed;

wherein performing the filling the trench and annealing is performed after the condensation technique.

10. The method of claim 9, wherein annealing is performed at a temperature of at least 1000° C.

11. The method of claim 9, further comprising implanting ions into the buried oxide layer of the substrate before growing the epitaxial layer.

12. The method of claim 11, wherein the ions are nitrogen ions, phosphorus ions, boron ions, or a combination thereof.

13. A method of making a channel region in a semiconductor device, the method comprising:

provding a substrate having a first transistor area arranged adjacent to a second transistor area, the substrate having a silicon support layer, a buried oxide layer arranged on the silicon support layer, and a silicon layer arranged on the buried oxide layer;

implanting ions into the buried oxide layer of the substrate to increase stress of the buried oxide layer;

growing an epitaxial layer comprising germanium only on the second transistor area of the substrate, the first transistor area protected by a mask;

forming a trench in the substrate between the first transistor area and the second transistor area, the trench directly contacting the silicon support layer and extending through the buried oxide layer and the silicon layer;

filling the trench with a dielectric material and annealing to form a shallow trench isolation region between a first channel region of the first transistor and a second channel region of the second transistor; and performing a condensation technique to thermally mix materials of the germanium of epitaxial layer with the silicon layer of the substrate to form a silicon germanium layer arranged on the buried oxide layer, the trench remaining an opening in the substrate while the condensation technique is being performed;

wherein performing the filling the trench and annealing is performed after the condensation technique.

* * * * *